(12) United States Patent
Lin et al.

(10) Patent No.: US 9,245,636 B2
(45) Date of Patent: Jan. 26, 2016

(54) NAND FLASH MEMORY UNIT, OPERATING METHOD AND READING METHOD

(71) Applicant: PHISON ELECTRONICS CORP., Miaoli (TW)

(72) Inventors: Wei Lin, Taipei (TW); Yu-Cheng Hsu, Yilan County (TW); Kuo-Yi Cheng, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 194 days.

(21) Appl. No.: 13/917,621

(22) Filed: Jun. 13, 2013

(65) Prior Publication Data
US 2014/0286105 A1   Sep. 25, 2014

(30) Foreign Application Priority Data

Mar. 25, 2013 (TW) .............................. 102110527 A

(51) Int. Cl.
| | |
|---|---|
| *G11C 11/00* | (2006.01) |
| *G11C 16/26* | (2006.01) |
| *H01L 29/792* | (2006.01) |
| *H01L 27/115* | (2006.01) |
| *G11C 11/56* | (2006.01) |
| *G11C 16/04* | (2006.01) |

(52) U.S. Cl.
CPC ............ *G11C 16/26* (2013.01); *G11C 11/5642* (2013.01); *G11C 16/0466* (2013.01); *G11C 16/0483* (2013.01); *H01L 27/11582* (2013.01); *H01L 29/7926* (2013.01)

(58) Field of Classification Search
CPC . G11C 27/115; G11C 27/11521; G11C 16/10
USPC ............................ 365/158, 171, 173; 257/314
See application file for complete search history.

(56) References Cited

U.S. PATENT DOCUMENTS 7,790,516 B2 *  9/2010  Willer et al. .................. 438/129

FOREIGN PATENT DOCUMENTS

TW            201426750         7/2014

OTHER PUBLICATIONS

"Office Action of Taiwan Counterpart Application", issued on Sep. 3, 2015, p1-p11, in which the listed reference was cited.

* cited by examiner

*Primary Examiner* — Son Dinh
(74) *Attorney, Agent, or Firm* — Jianq Chyun IP Office

(57) ABSTRACT

A NAND flash memory unit, an operating method and a reading method are provided. The NAND flash memory unit includes a plurality of gate layers, a tunnel layer, a charge trapping layer, a conductor layer and a second dielectric layer. A first dielectric layer is included between two adjacent gate layers among the gate layers. The tunnel layer, the charge trapping layer, the conductor layer, and the second dielectric layer penetrate the gate layers. The charge trapping layer is disposed between the tunnel layer and the gate layers, and the second dielectric layer is disposed between the conductor layer and the tunnel layer. Therefore, an erasing speed may be increased; the charge trapping layer may be repaired; the controllability of the gate layers may be increased.

9 Claims, 14 Drawing Sheets

NAND FLASH MEMORY UNIT, OPERATING METHOD AND READING METHOD

CROSS-REFERENCE TO RELATED APPLICATION

This application claims the priority benefit of Taiwan application serial no. 102110527, filed on Mar. 25, 2013. The entirety of the above-mentioned patent application is hereby incorporated by reference herein and made a part of this specification.

BACKGROUND

1. Technology Field

The present invention generally relates to a flash memory unit, in particular, to a NAND flash memory unit as well as an operating method and a reading method of the memory unit.

2. Description of Related Art

A NAND structure has been widely used in the design of non-volatile memory devices to increase storage density. A NAND flash memory unit commonly includes a plurality of memory cells concatenating to each other. Along with process shrink, there exist many difficulties in manufacturing NAND flash memory units that may lead to decreases in data reliability. In recent years, many three-dimensional NAND flash memory units such as a terabit cell array transistor (TCAT), a stacked memory array transistor (SMArt) or a bit coast scalable (BiSC) technology are proposed in the industry to alleviate the problems during the process shrink. Silicon nitride is used for storing data in some of the three-dimensional NAND flash memory units, and yet there exists a trade-off between the data retention and the erasing speed in such memory cells. Once the erasing speed is increased, the data retention may be worse. Accordingly, to maintain the erasing speed and the data retention of such memory cells is highly concerned by those skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a NAND flash memory unit as well as corresponding operating and reading methods which may increase the speed of an erasing operation, repair a charge trapping layer, and increase the controllability of gate layers.

According to an exemplary embodiment of the present invention, a NAND flash memory unit including a plurality of gate layers, a tunnel layer, a charge trapping layer, a conductor layer and a second dielectric layer is provided. A first dielectric layer is included between two adjacent gate layers among the gate layers. The tunnel layer, the charge trapping layer, the conductor layer, and the second dielectric layer penetrate the gate layers. The charge trapping layer is disposed between the tunnel layer and the gate layers, and the second dielectric layer is disposed between the conductor layer and the tunnel layer.

From another point of view, according to an exemplary embodiment of the present invention, a reading method for the aforementioned NAND flash memory unit is provided. The reading method includes the following steps. A reading voltage is applied to one of the gate layers. A passing voltage is applied to another one of the gate layers. A first voltage is applied to a side of the conductor layer. The voltage level of the reading voltage is one of a positive level and a negative level, while the voltage level of the first voltage is the other one of the positive level and the negative level.

From another point of view, according to an exemplary embodiment of the present invention, an operating method of a NAND flash memory unit is provided. The NAND flash memory unit includes a plurality of gate layers, a conductive structure, and a charge trapping layer. The conductive structure and the charge trapping layer penetrate the gate layers, and the charge trapping layer is disposed between the conductive structure and gate layers. The operating method includes the following steps. An electric potential difference is applied between a first end of the conductive structure and a second end of the conductive structure so as to generate a current in the conductive structure to heat up the charge trapping layer.

To sum up, a NAND flash memory unit, a reading method, and an operating method provided in the exemplary embodiments of the present invention may heat up a charge trapping layer during an erasing operation so as to increase the speed of the erasing operation. Moreover, the controllability of gate layers may be increased while reading the NAND flash memory unit.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
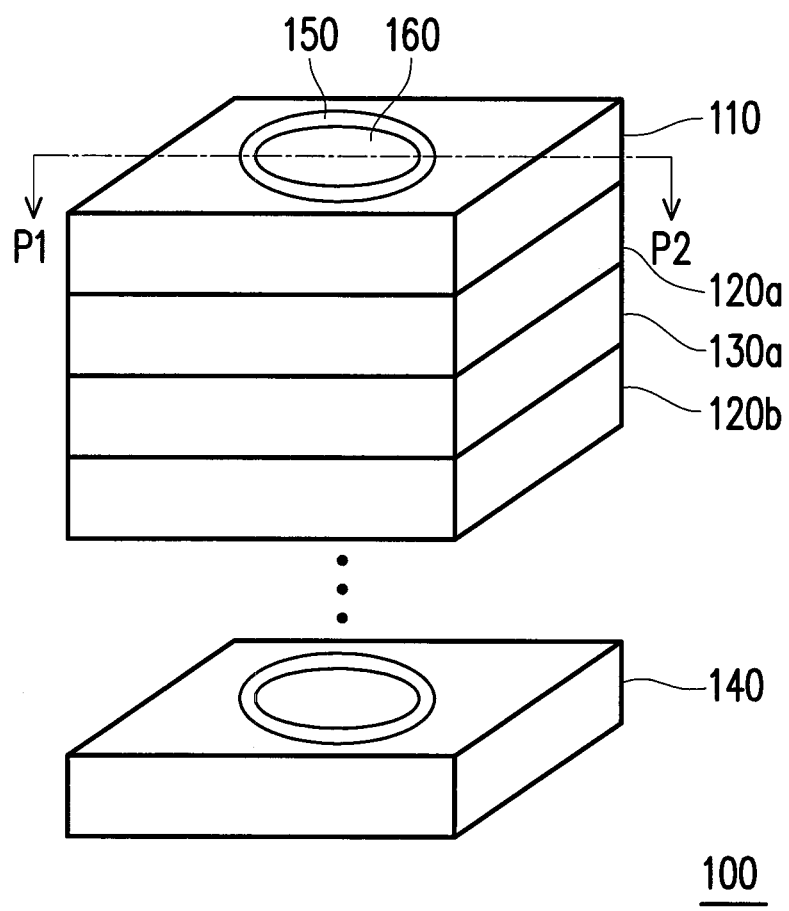
FIG. 1A depicts a schematic diagram of a NAND flash memory unit according to an exemplary embodiment.

Reference will now be made in detail to the present embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 1B:
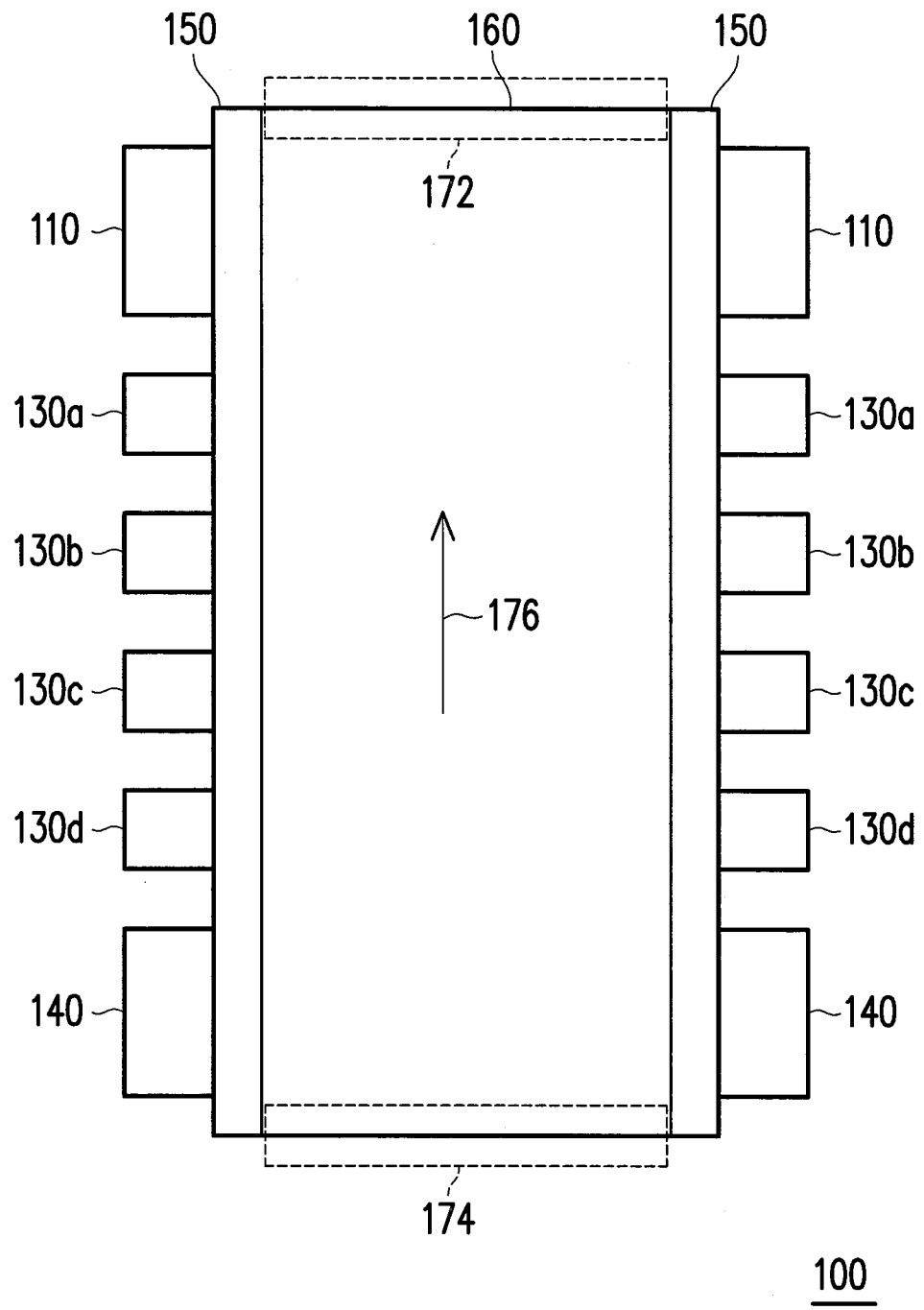
FIG. 1B depicts a cross-sectional view of the NAND flash memory unit taken along the line P1-P2 in FIG. 1A.

FIG. 1A depicts a schematic diagram of a NAND flash memory unit according to an exemplary embodiment. FIG. 1B depicts a cross-sectional view of the NAND flash memory unit taken along the line P1-P2 in FIG. 1A.

Referring to FIG. 1A and FIG. 1B, a NAND flash memory unit 100 includes a select gate layer 110 (also referred to as a first select gate layer), a plurality of gate layers 130a-130d and a select gate layer 140 (also referred to as a second select gate layer). The gate layers 130a-130d stack on top of each other, and a dielectric layer (also referred to as a first dielectric layer such as a dielectric layer 120b) is included between every two adjacent gate layers among the gate layers. The select gate layer 110 is disposed on a side of the gate layers 130a-130d, and the select gate layer 140 is disposed on another side of the gate layers 130a-130d. A dielectric layer 120a is included between the select gate layer 110 and the gate layer 130a, and a dielectric layer (not shown) is included between the select gate layer 140 and the gate layer 130d as well. For purposes of simplicity, it is noted that the dielectric layers 120a and 120b are not illustrated in FIG. 1B so that the relationship among the select gate layer 110 and 140, and the gate layers 130a-130d are more clarified. The NAND flash memory unit 100 further includes a charge trapping layer 150 and a conductive structure 160. The charge trapping layer 150 and the conductive structure 160 penetrate the select gate layers 110 and 140, the dielectric layers 120a and 120b, and the gate layers 130a-130d. It is noted that, only four gate layers 130a-130d are illustrated in FIG. 1A and FIG. 1B, and yet the present invention is not limited thereto. In other exemplary embodiments, the NAND flash memory unit 100 may include more or less number of gate layers.

The materials of the dielectric layers 120a and 120b may include silicon oxide, phosphosilicate glass (PSG), or other materials with low dielectric constants. The materials of the select gate layers 110 and 140, and the gate layer 130a-130d may include doped poly-silicon or metals. In the present exemplary embodiment, the charge trapping layer 150 may be composed of a plurality of dielectric layers. For example, the material of the charge trapping layer 150 may include a silicon oxide-silicon nitride-silicon oxide (ONO) composite layer. However, the present invention is not limited thereto. In another exemplary embodiment, the aforementioned silicon nitride may be replaced by a doped poly-silicon floating gate layer or other materials adaptable for storing electrons or electron holes. The conductive structure 160 may include metals or doped poly-silicon. In particular, an electric potential difference may be applied between a first end 172 and a second end 174 of the conductive structure 160 for generating a current 176 in the conductive structure 160. In the present exemplary embodiment, the first end 172 is a drain end, and the second end 174 is a source end. That is, the current 176 flows from the source end to the drain end. However, the present invention is not limited thereto. In other exemplary embodiments, the first end 172 may be the source end, and the second end 174 may be the drain end. The current 176 may flow from the drain end to the source end. The current 176 is used for heating up the charge trapping layer 150. In one exemplary embodiment, the usage lifetime of the NAND flash memory unit 100 or the erasing speed may be increased by heating up the charge trapping layer 150. A more detail explanation is illustrated in the following exemplary embodiments.

Figure 1C:
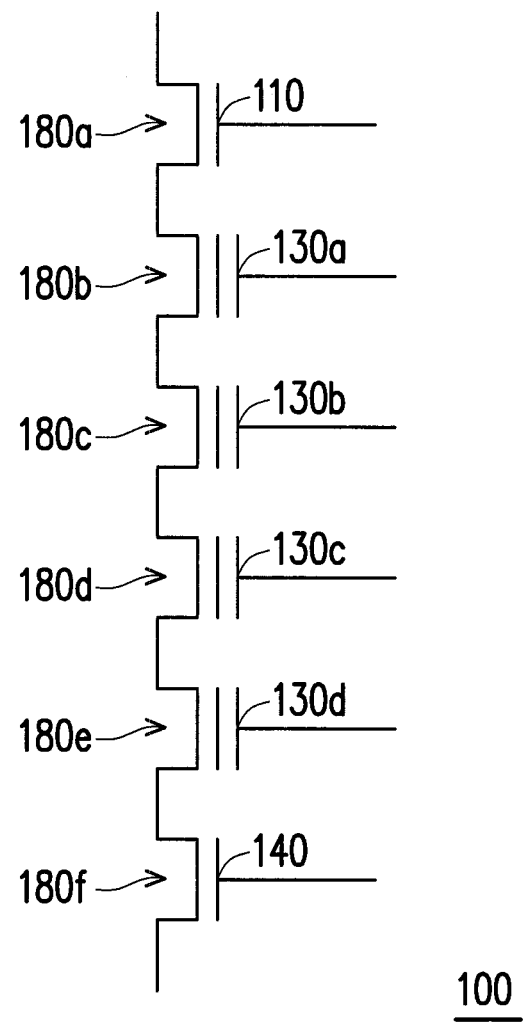
FIG. 1C is a circuit diagram of a NAND flash memory unit according to an exemplary embodiment.

FIG. 1C is a circuit diagram of a NAND flash memory unit according to an exemplary embodiment.

Referring to FIG. 1B and FIG. 1C, a combination of the select gate layers 110 and 140, the gate layers 130a-130d, the charge trapping layer 150, and the conductive structure 160 may be viewed as transistors 180a-180f. The conductive structure 160 includes tunnels of the transistors 180a-180f. The select gate layers 110 and 140 are control gates of the transistors 180a and 180f respectively. The gate layers 130a-130d are control gates of the transistors 180b-180e respectively. In other words, the voltages at the select gate layers 110 and 140, and the gate layers 130a-130d are used to control the ON/OFF of the transistors 180a-180f. The transistors 180b-180e may also be referred to as memory cells, wherein each of the memory cells may store one or multiple bits.

Figure 2:
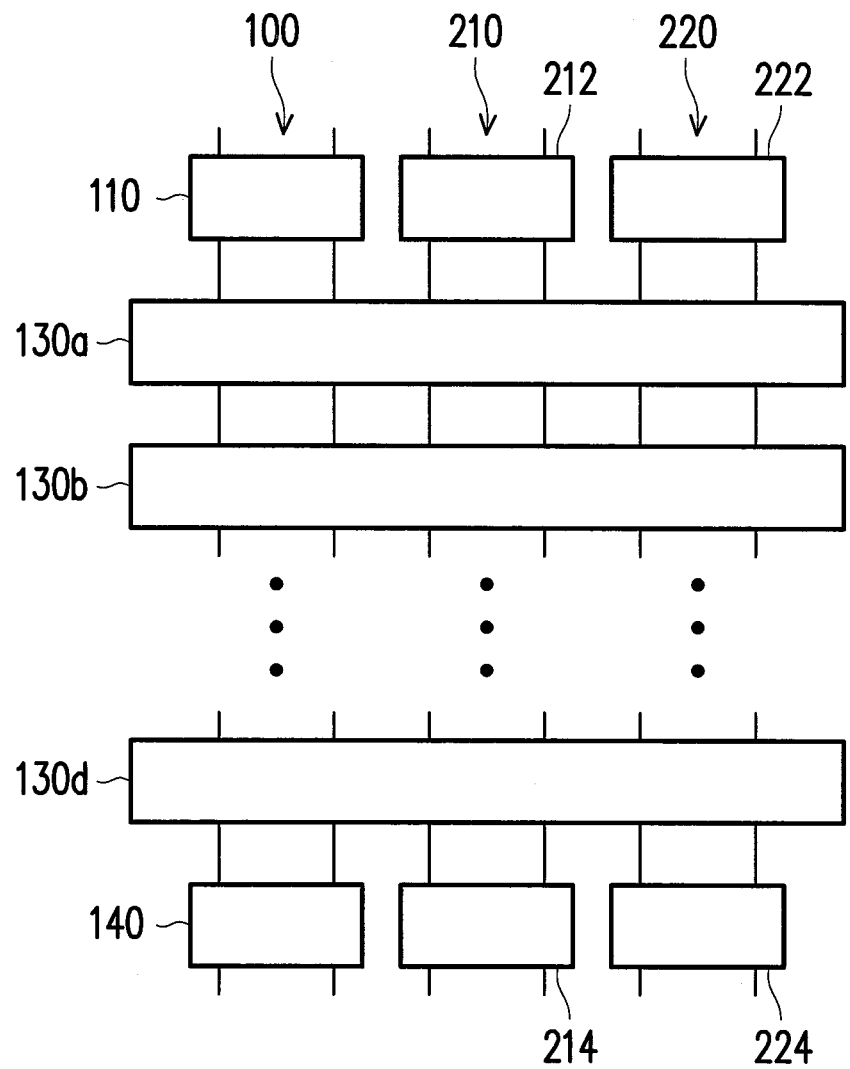
FIG. 2 depicts a partial schematic diagram of a NAND flash memory module according to an exemplary embodiment.

FIG. 2 depicts a partial schematic diagram of a NAND flash memory module according to an exemplary embodiment.

The NAND flash memory unit 100 may be included in a NAND flash memory module, wherein the NAND flash memory module may further include other structures similar to the NAND flash memory unit 100. The NAND flash memory unit 100 and the other similar structures may combine to form a physical block, and the NAND flash memory module may include a plurality of physical blocks. For example, as illustrated in FIG. 2, a NAND flash memory module 200 includes the NAND flash memory unit 100, NAND flash memory units 210 and 220, wherein the gate layers 130a-130d are shared among them. Each of the NAND flash memory units 210 and 220 may include a conductive structure and a charge trapping layer. The NAND flash memory unit 210 further includes select gate layers 212 and 214. The NAND flash memory unit 220 further includes select gate layers 222 and 224. The conductive structures in the NAND flash memory units 110, 120, and 220 may be served as bit lines, and each of the gate layers 130a-130d may be served as a word line. It is noted that, a top end and a bottom end of each of the NAND flash memory unit 110, 210, and 220 may be connected to other structures (e.g. another conductor). The present invention is not limited thereto. Alternatively, the select gate layers 140, 214, and 224 may be connected to each other.

The First Exemplary Embodiment

Figure 3:
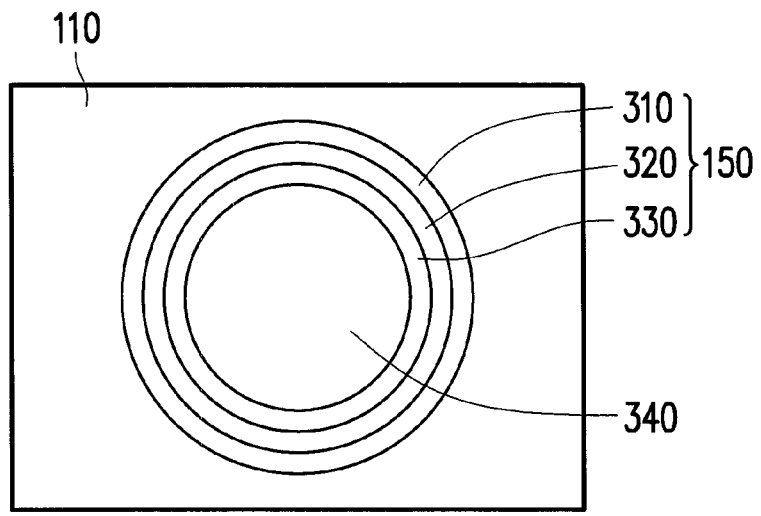
FIG. 3 depicts a top view of the NAND flash memory unit 100 according to the first exemplary embodiment.

FIG. 3 depicts a top view of the NAND flash memory unit 100 according to the first exemplary embodiment.

Referring to FIG. 3, in the first exemplary embodiment, the charge trapping layer 150 includes a silicon oxide layer 310, a silicon nitride layer 320, and a silicon oxide layer 330. The conductive structure 160 in FIG. 1A and FIG. 1B is implemented as a tunnel layer 340. The material of the tunnel layer 340 includes doped poly-silicon. In the present exemplary embodiment, the tunnel layer 340 is formed by doped $n^+$-type poly-silicon. However, the present invention is not limited thereto. The tunnel layer 340 may also be formed by doped $p^+$-type poly-silicon.

Figure 4:
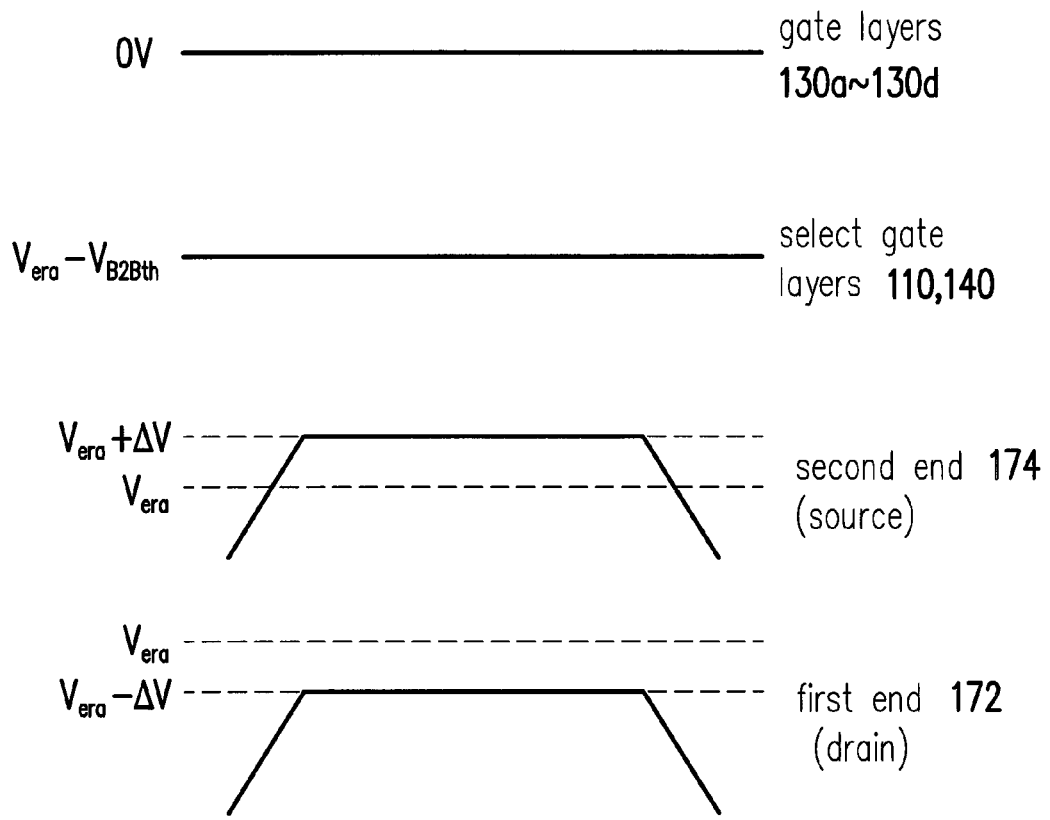
FIG. 4 depicts a schematic diagram of voltages during an erasing operation according to the first exemplary embodiment.

FIG. 4 depicts a schematic diagram of voltages during an erasing operation according to the first exemplary embodiment.

Referring to FIG. 1B and FIG. 4, during an erasing operation, a voltage with 0 volts is applied to the gate layers 130a-130d; a voltage with $(V_{era}-V_{B2Bth})$ volts is applied to the select gate layers 110 and 140; a voltage with $(V_{era}+\Delta V)$ volts is applied to the second end 174; a voltage with $(V_{era}-\Delta V)$ volts is applied to the first end 172. $V_{era}$, $\Delta V$, and $V_{B2Bth}$ are real numbers, and yet the values of $V_{era}$, $\Delta V$, and $V_{B2Bth}$ are not limited in the present invention. A voltage with $V_{era}$ volts (e.g. 20 volts), also referred to as an erasing voltage, is used to erase the data stored in the charge trapping layer 150 of the NAND flash memory unit 100. A voltage with $V_{B2Bth}$ volts, also referred to as a tunneling voltage, is used to generate a band-to-band tunneling effect. To be more specific, the electric potential difference between the first end 172 and the select gate layer 110 is approximately $V_{B2Bth}$ volts and may allow electrons to move from the select gate layer 110 to the first end 172 (or may allow electron holes to move from the first end 172 to the select gate layer 110). In particular, since an electric potential difference ($2\Delta V$) is applied between the first end 172 and the second end 174 of the tunnel layer 340, a current is thus generated in the tunnel layer 340 so as to heat up the charge trapping layer 150. Hence, the speed of the erasing operation may be increased accordingly. In the present exemplary embodiment, the voltage level at the first end 172 is be ($V_{era}-\Delta V$) volts, and the voltage level at the second end 174 is ($V_{era}+\Delta V$) volts. However, in other exemplary embodiments, the voltage level at the first end 172 may be $V_{era}$ volts, and the voltage level at the second end 174 may be ($V_{era}+2\Delta V$) volts. Alternatively, the voltage level at the first end 172 may be ($V_{era}-2\Delta V$) volts, and the voltage level at the second end 174 may be $V_{era}$ volts. The way to apply an electric potential difference between the first end 172 and the second end 174 is not limited in the present invention.

In the present exemplary embodiment, the voltage level at the gate layer 130a-130d is 0 volts. However, in another exemplary embodiment, the voltage level at each of the gate layers 130a-130d may be a base value. In the mean time, the voltage level at each of the select gate layers 110 and 140, and the both ends of the conductive structure 160 may be adjusted based on the base value (e.g. by adding to the base value). Suppose that the base value is 3 volts herein. Thus, a base voltage is applied to the gate layers 130a-130d, wherein the voltage level of the base voltage is 3 volts. A third voltage is applied to the select gate layers 110 and 140, wherein the voltage level of the third voltage is generated based on the voltage level of the base voltage, the voltage level of the erasing voltage, and the voltage level of the tunneling voltage, e.g. $(3+V_{era}-V_{B2Bth})$ volts. Additionally, the voltage level at the second end 174 may be $(3+V_{era}+\Delta V)$ volts, and the voltage level at the first end 172 may be $(3+V_{era}-\Delta V)$ volts. However, the base value is not limited in the present invention. In fact, such base value may be any real number.

Figure 5:
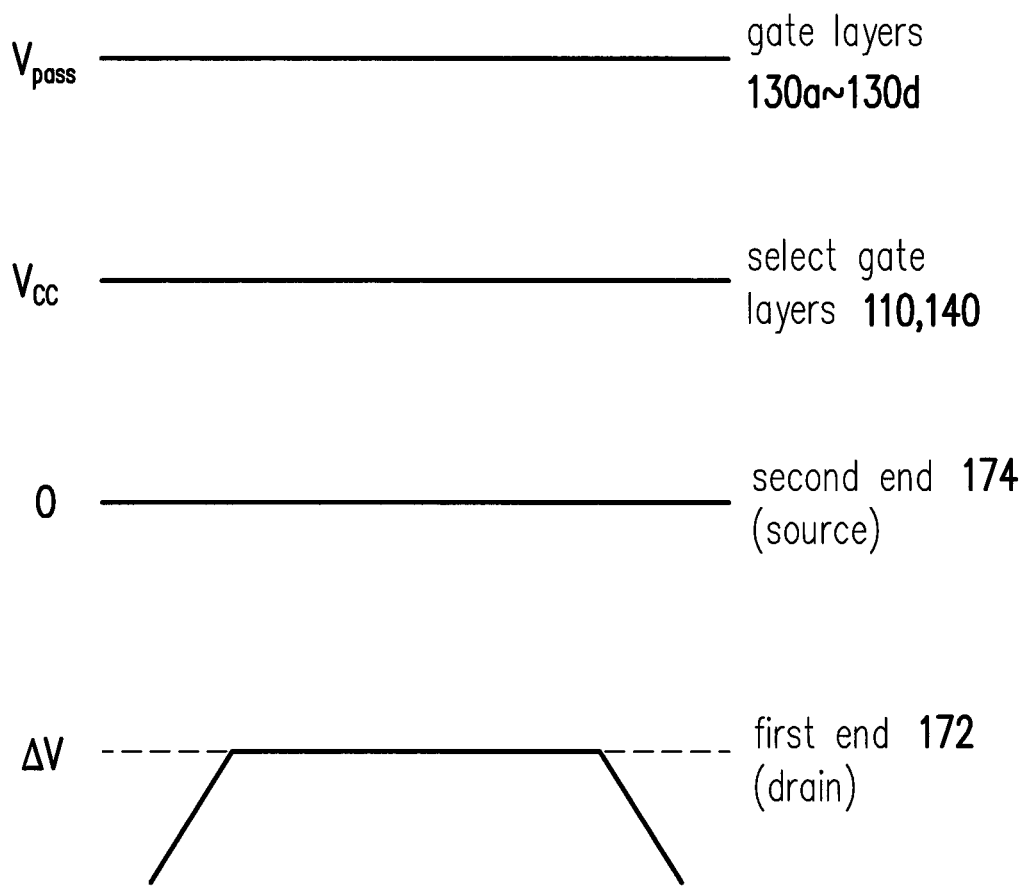
FIG. 5 is a schematic diagram of voltages during repairing of a charge trapping layer according to the first exemplary embodiment.

FIG. 5 is a schematic diagram of voltages during repairing of a charge trapping layer according to the first exemplary embodiment.

Referring to FIG. 5, in one exemplary embodiment, a voltage with $V_{pass}$ volts, also referred to as a passing voltage, is applied to the gate layers 130a-130d; a voltage with $V_{cc}$ volts, also referred to as a system voltage, is applied to the select gate layers 110 and 140; a voltage with 0 volts is applied to the second end 174; a voltage with $\Delta V$ volts is applied to the first end 172. $V_{pass}$ and $V_{cc}$ are real numbers. For example, $V_{pass}$ may be 6.5, and $V_{cc}$ may be 3, and yet the values of $V_{pass}$ and $V_{cc}$ are not limited in the present invention. The voltage with $V_{pass}$ volts is used to turn on the transistors corresponding to the gate layers 130a-130d. The voltage with $V_{cc}$ volts is used to turn on the transistors corresponding to the select gate layers 110 and 140. In the present exemplary embodiment, if the tunnel layer 340 is formed by doped $n^+$-type poly-silicon or doped $p^+$-type poly-silicon, $V_{pass}$ volts may be 0. That is, the entire tunnel layer 340 is conducted, and an electric potential difference is applied between the first end 172 and the second end 174 so as to generate a current and further heat up the charge trapping layer 150. In other words, the current in the tunnel layer 340 may be generated during erasing or may be generated at any other time. The present invention is not limited herein. Accordingly, the charge trapping layer 150 could be repaired, and data may not be easily lost accordingly (i.e. the usage lifetime of the NAND flash memory unit 100 is increased).

In the exemplary embodiment of FIG. 5, the voltage level at the second end 174 is 0 volts, and the voltage level at the first end 172 is $\Delta V$ volts. However, in other exemplary embodiments, the voltage level at the second end 174 may be any values, and the voltage level at the first end 172 may be a different value so as to generate the electric potential difference between the first end 172 and the second end 174. However, the way to generate such electric potential difference is not limited in the present invention.

The Second Exemplary Embodiment

Figure 6A:
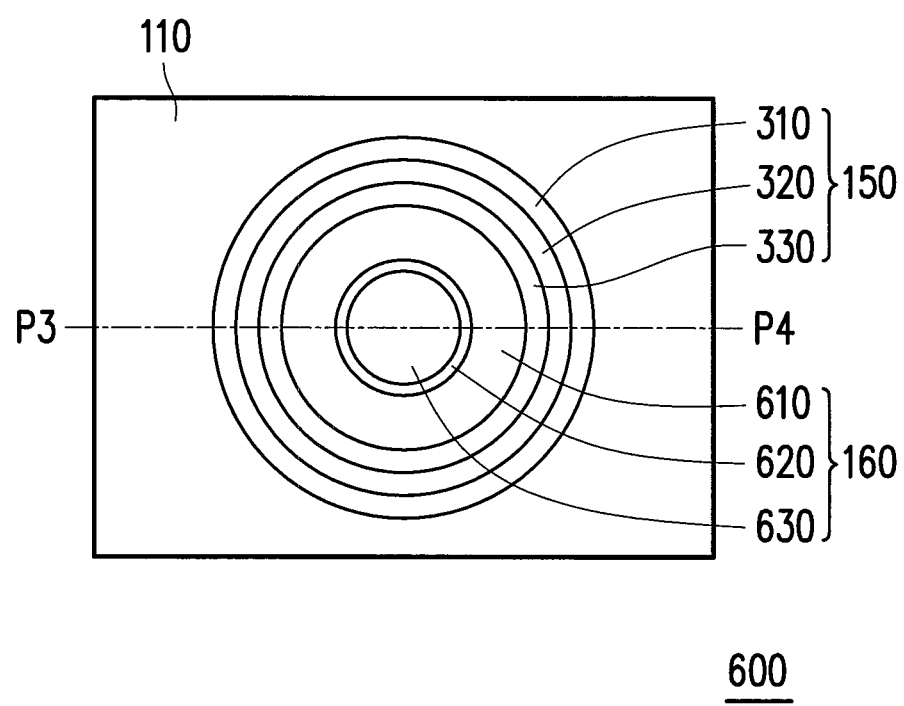
FIG. 6A depicts a top view of a NAND flash memory unit 600 according to the second exemplary embodiment.
Figure 6B:
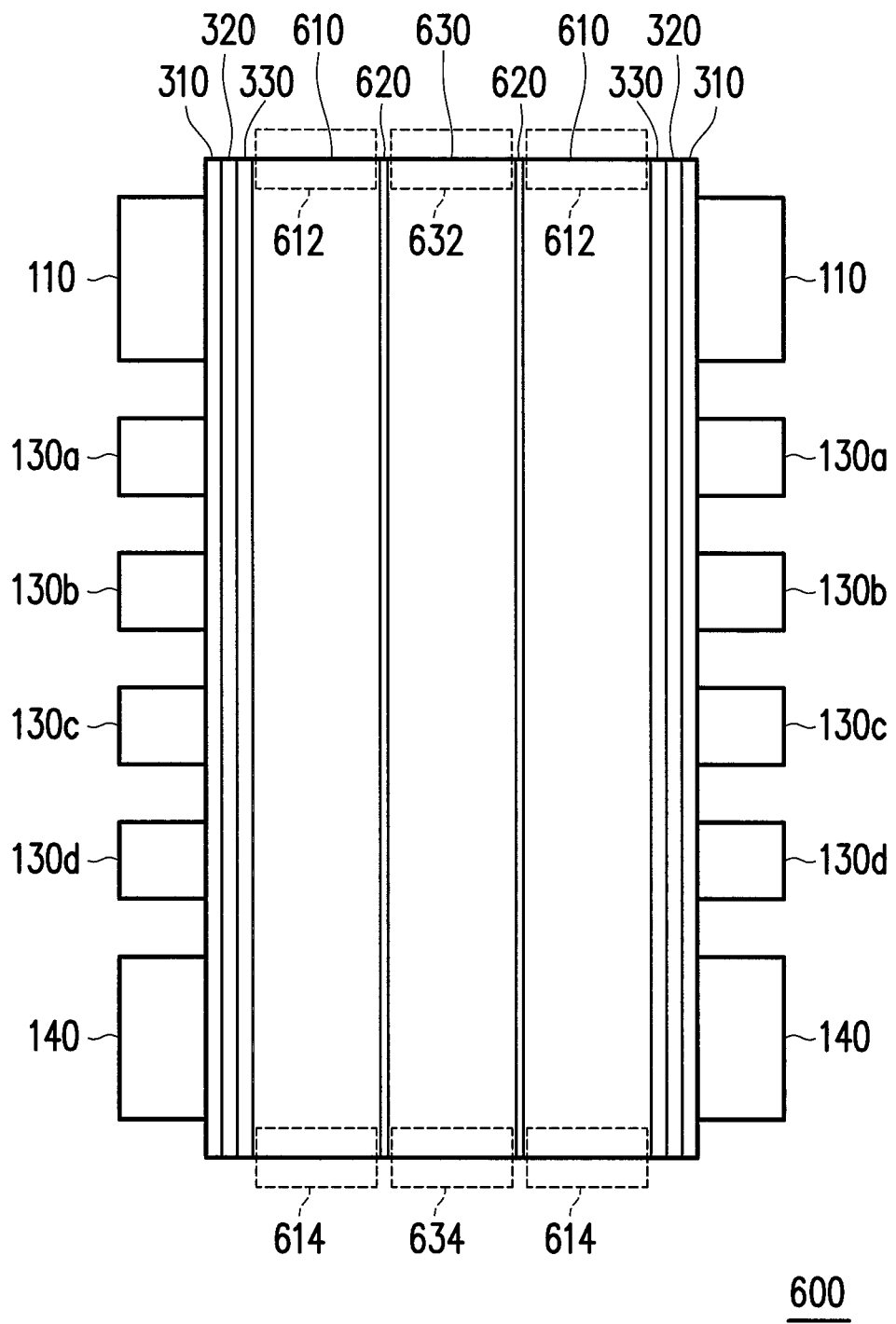
FIG. 6B depicts a cross-sectional view of the NAND flash memory unit 600 taken along the line P3-P4 in FIG. 6A.

FIG. 6A depicts a top view of a NAND flash memory unit 600 according to the second exemplary embodiment. FIG. 6B depicts a cross-sectional view of the NAND flash memory unit 600 taken along the line P3-P4 in FIG. 6A.

Referring to FIG. 6A and FIG. 6B, in the second exemplary embodiment, the charge trapping layer 150 includes the silicon oxide layer 310, the silicon nitride layer 320, and the silicon oxide layer 330. The conductive structure 160 includes a tunnel layer 610, a dielectric layer 620 (also referred to as a second dielectric layer), and a conductor layer 630. The tunnel layer 610 is disposed between the dielectric layer 620 and the silicon oxide layer 330, and the dielectric layer 620 is disposed between the tunnel layer 610 and the conductor layer 630. A combination of the tunnel layer 610, the charge trapping layer 150, the select gate layers 110 and 140, and the gate layers 130a-130b may be viewed as a plurality of transistors concatenating to each other. In the present exemplary embodiment, a first end 612 of the tunnel layer 610 is a drain end, and a second end 614 is a source end. However, the present invention is not limited thereto. In other exemplary embodiments, the first end 612 may also be the source end, and the second end 614 may be the drain end.

The material of the tunnel layer 610 includes amorphous silicon, poly-silicon, microcrystalline silicon, monocrystalline silicon, nanocrystalline silicon, an oxide semiconductor material, an organic semiconductor material, other suitable materials, or a combination of at least any two of the aforementioned materials. In the present exemplary embodiment, the tunnel layer 610 is formed by n-type poly-silicon. However, the tunnel layer 610 may be also formed by p-type poly-silicon. The present invention is not limited herein. The material of the dielectric layer 620 includes silicon oxide, phosphosilicate glass (PSG), or other materials with low dielectric constants. The material of the conductor layer 630 may include metals or doped poly-silicon.

Figure 7:
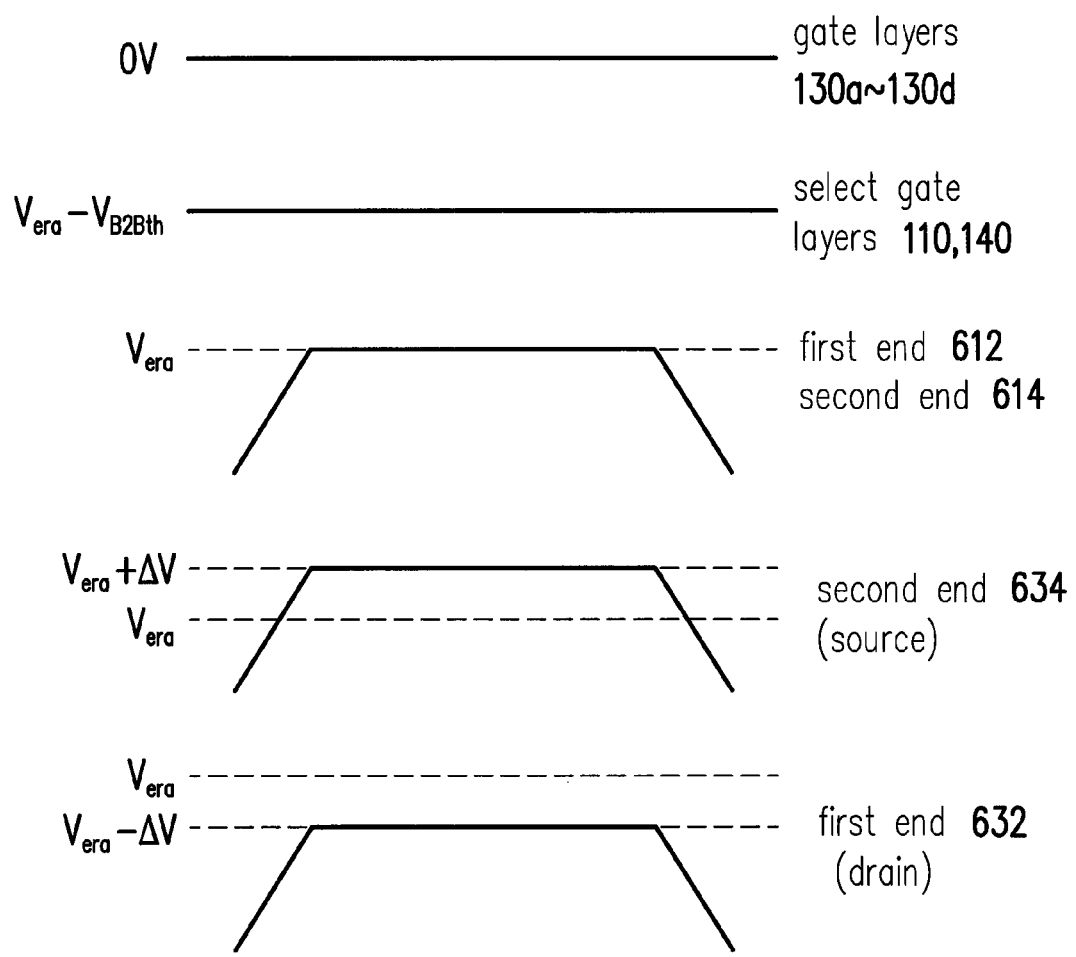
FIG. 7 is a schematic diagram of voltages during an erasing operation according to the second exemplary embodiment.

FIG. 7 is a schematic diagram of voltages during an erasing operation according to the second exemplary embodiment.

Referring to FIG. 6B and FIG. 7, a voltage with 0 volts is applied to the gate layer 130a-130d; a voltage with ($V_{era}-V_{B2Bth}$) volts is applied to the select gate layers 110 and 140; a voltage with $V_{era}$ volts is applied to the first end 612 and the second end 614. It is noted that, an electric potential difference is applied between both ends of the conductor layer 630. For example, a voltage with ($V_{era}+\Delta V$) volts is be applied to a second end 634, and a voltage with (Vera−$\Delta V$) volts is applied to a first end 632. Thus, a current may be generated in the conductor layer 630 during the erasing operation so that the charge trapping layer 150 may be heated up so as to speed up the erasing operation. However, in another exemplary embodiment, a voltage with $V_{era}$ volts may be applied to one of the first end 612 and the second end 614, while another of them may be floating. The present invention is not limited herein.

Similar to the first exemplary embodiment, the voltage level at each of the gate layers 130a-130d may be a base value. In the mean time, the voltage level at each of the select gate layers 110 and 140, the first end 612, and the second end 614 are adjusted based on the base value (e.g. by adding to the base value). The details may not be repeated herein. In one exemplary embodiment, the voltage levels at the first end 632 and the second end 634 are adjusted based on the base voltage as well (e.g. by adding to the base value). That is, the voltage levels at the first end 632 and the second end 634 are generated based on the voltage level of the base voltage, the voltage level of the erasing voltage, and the voltage level of an offset voltage (a voltage with $\Delta V$ volts), wherein there exists an electric potential difference (e.g. an electric potential difference with 2$\Delta V$ volts) between the first end 632 and the second end 634. The way to apply an electric potential difference between the first end 632 and the second end 634 is not limited in the present invention.

Figure 8:
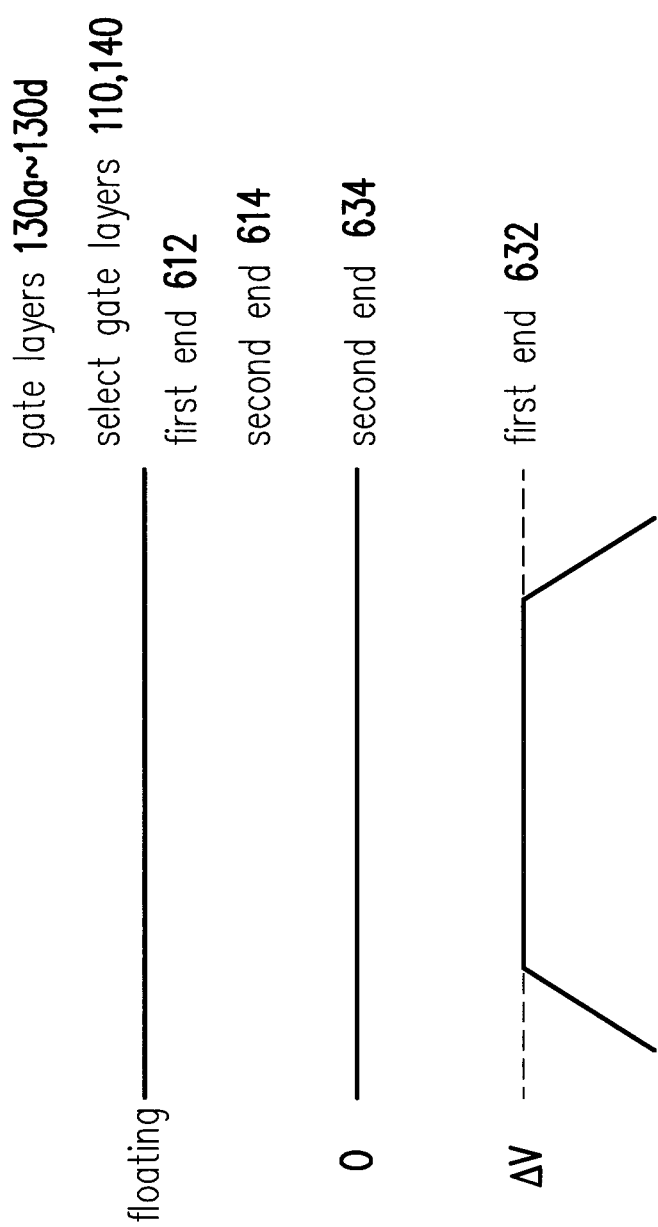
FIG. 8 depicts a schematic diagram of voltages during repairing of a charge trapping layer according to the second exemplary embodiment.

FIG. 8 depicts a schematic diagram of voltages during repairing of a charge trapping layer according to the second exemplary embodiment.

Referring to FIG. 8, the gate layers 130a-130d, the select gate layers 110 and 140, the first end 612, and the second end 614 are floating. In other words, the voltage level at the gate layers 130a-130d, the select gate layers 110 and 140, the first end 612, and the second end 614 may be any values, and each of them may be different. An electrical potential difference is applied between the both ends of the conductor layer 630. For example, a voltage with 0 volts is applied to the second end 634, and a voltage with $\Delta V$ volt is applied to the first end 632. Similarly, the electric potential difference between the both ends of the conductor layer 630 is used to generate a current so as to heat up the charge trapping layer 150. That is, the charge trapping layer 150 may be heated up at any time other than the erasing operation so that data may not be easily lost.

In another exemplary embodiment, the voltage level at each of the first end 632 and the second end 634 may be an input parameter of a function, and such function outputs a value. A voltage with the value is applied to the gate layers 130a-130d, the select gate layers 110 and 140, the first end 612, and the second end 614. The output value is between the voltage level at the first end 632 and the voltage level at the second end 634. For example, the voltage level at the first end 632 is 5 volts, the voltage level at the second end 634 is 7 volts, and the output value of the function is 6. Hence, it may prevent the NAND flash memory unit 600 from being brought into a programming state. However, the value of the output is not limited in the present invention.

In the exemplary embodiment of FIG. 8, the voltage level at the second end 634 is 0 volts, and the voltage level at the first end 632 is $\Delta V$ volts. However, in other exemplary embodiments, the voltage level at the second end 634 may be any values, and the voltage level at the first end 632 may be a different value so as to generate an electric potential difference between the first end 632 and the second end 634. The way to generate such electric potential difference is not limited in the present invention.

Figure 9:
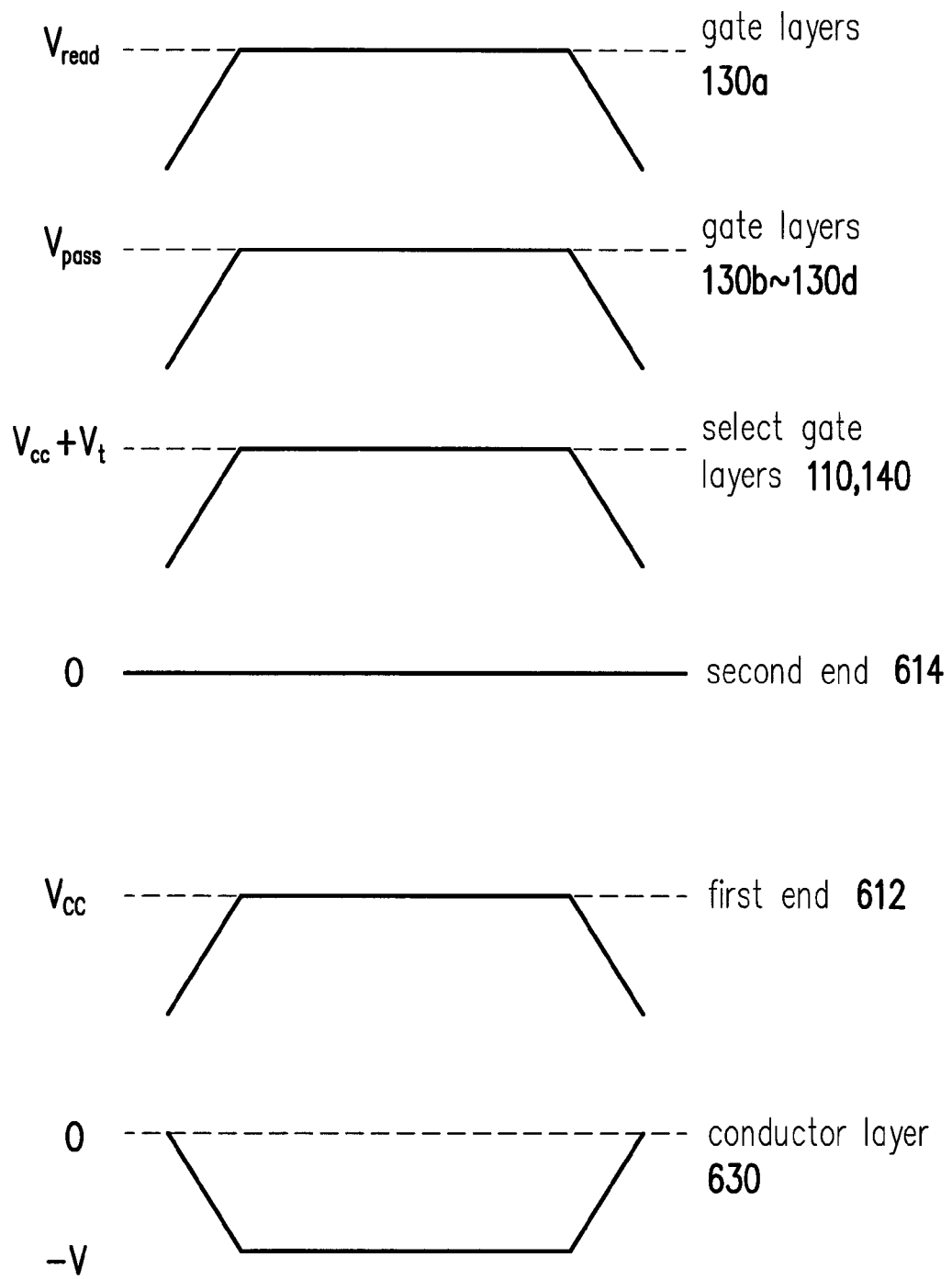
FIG. 9 is a schematic diagram of voltages during a reading operation according to the second exemplary embodiment.

FIG. 9 is a schematic diagram of voltages during a reading operation according to the second exemplary embodiment.

Referring to FIG. 6B and FIG. 9, suppose that the data stored in the transistor corresponding to the gate layer 130a is to be read. A voltage with $V_{read}$ volts, also referred to as a reading voltage, is applied to the gate layer 130a. A voltage with $V_{pass}$ volts is applied to the gate layer 130b-130d. A voltage with ($V_{cc}+V_t$) volts is applied to the select gate layers 110 and 140. A voltage with 0 volts is applied to the second end 614. A voltage with $V_{cc}$ volts is applied to the first end 612. A voltage with (−V) volts, also referred to as a first voltage, is applied to the conductor layer 630. $V_{read}$, $V_{pass}$, $V_{cc}$, $V_t$, and V are real numbers, and yet the values thereof are not limited in the present invention. The transistor corresponding to the gate layer 130a may be turned on or turned off based on the value of $V_{read}$. The voltage with $V_{pass}$ volts is used to turn on the transistor corresponding to the gate layer 130b-130d. The voltage with ($V_{cc}+V_t$) volts is used to turn on the transistors corresponding to the select gate layers 110 and 140. $V_t$ is referred to as a threshold voltage level, and the voltage levels at the select gate layers 110 and 140 are an addition of $V_{cc}$ and $V_t$. Therefore, the electric potential difference between the select gate layer 110 and the first end 612 is the threshold voltage level $V_t$ so that $V_t$ is used to turn on the transistor corresponding to the select gate layer 110. The voltage with $V_{cc}$ volts is used to test if the transistor corresponding to the gate layer 130a is turned on so as to read the data stored in the transistor. To be more specific, the first end 612 is pre-charged to $V_{cc}$ volts (also referred to as a system voltage level). After the transistors corresponding to the gate layers 130b-130d and the select gate layers 110 and 140 are turned on, if the voltage level at the first end 612 decreases, it represents that the transistor corresponding to the gate layer 130a has been turned on. In one exemplary embodiment, the values of $V_{read}$, $V_{pass}$, $V_{cc}$, and V are positive, and the voltage level at the conductor layer 630 is negative. That is, the voltage level at the conductor layer 630 is less than that at a ground end (0 volts). Thus, the electrons in the tunnel layer 610 approach to the gate layer 130a, and the controllability of the gate layer 130a is increased accordingly.

In another exemplary embodiment, the material of the tunnel layer 610 may be p-type poly-silicon, and the voltage level of the reading voltage ($V_{read}$) is less than 0, and the voltage level of the first voltage (−V) is greater than 0 so that the electron holes in the tunnel layer 610 approach to the gate layer 130a. In other words, if the voltage level of the reading voltage is a positive level, the voltage level of the first voltage is a negative level. If the voltage level of the reading voltage is the negative level, then the voltage level of the first voltage is the positive level (greater than the voltage at the ground end).

Figure 10A:
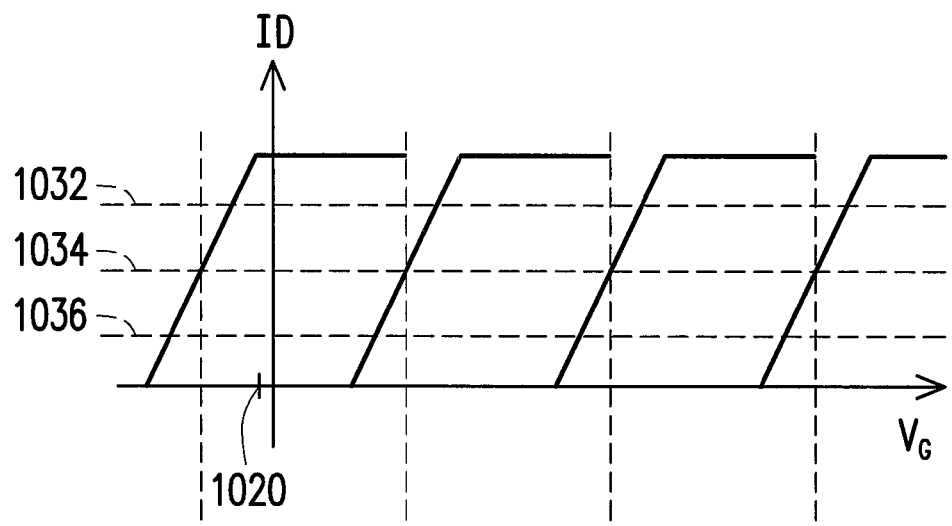
FIG. 10A is a schematic diagram of a voltage and a current at the gate layer 130a according to the second exemplary embodiment.
Figure 10B:
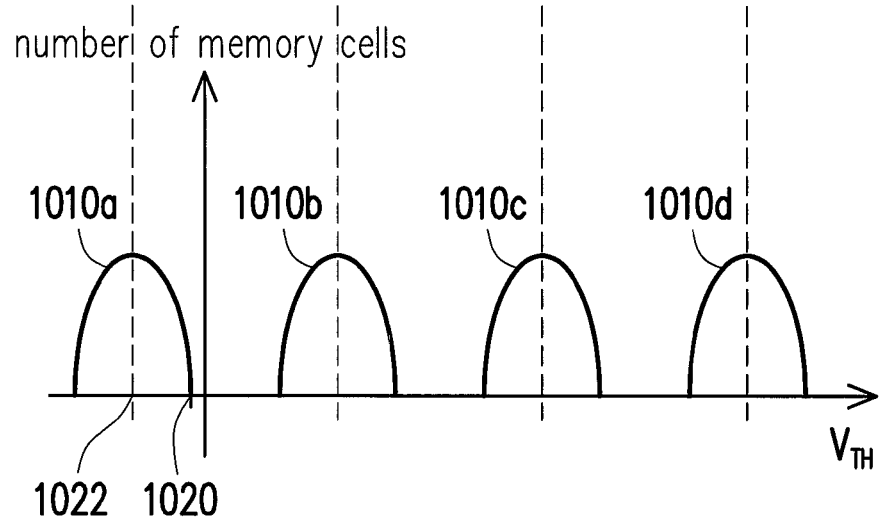
FIG. 10B is a schematic diagram of distributions of memory cells after being programmed.

FIG. 10A is a schematic diagram of a voltages and a current at the gate layer 130a according to the second exemplary embodiment. FIG. 10B is a schematic diagram of distributions of memory cells after being programmed.

The horizontal axis in FIG. 10A represents the voltage level at the gate layer 130a, and the vertical axis is the value of the current at the tunnel layer 610. The horizontal axis in FIG. 10B represents the threshold voltage at a memory cell, and the vertical axis is the number of the memory cells. Referring to FIG. 6B, FIG. 10A, and FIG. 10B, suppose that a memory cell may store two bits. Hence, after the memory cell (transistor) corresponding to the gate layer 130a is programmed, the threshold voltage at the transistor follows one of four distributions 1010a-1010d. For example, the distribution 1010a represents the bits "11", and the distribution 1010d represents the bits "00". If the threshold voltage of the transistor follows the distribution 1010a and the voltage level at the gate layer 130a is a voltage level 1020, the transistor is entirely turned on, that is, the bits stored in the transistor are "11". On the other hand, if the voltage level at the gate layer 130a is a voltage level 1022, the transistor may be partially turned on, and the current at the tunnel layer 610 is a current amount 1034. In an exemplary embodiment, a current amount 1032 and a current amount 1036 are threshold values used to determine if the transistors are turned on. For example, when the current at the tunnel layer 610 is greater than the current amount 1032, it represents that the corresponding transistor is turned on. On the other hand, when the current at the tunnel layer 610 is less than the current amount 1036, it represents that the corresponding transistor is not turned on. Therefore, the current amount 1032 and the current amount 1036 may be used for determining the distribution corresponding to the transistor among the distributions 1010a-1010d. When the distribution corresponding to the transistor is more easily to be determined from the distributions 1010a-1010d, it represents that the controllability of the gate layer 130a is better.

Figure 10C:
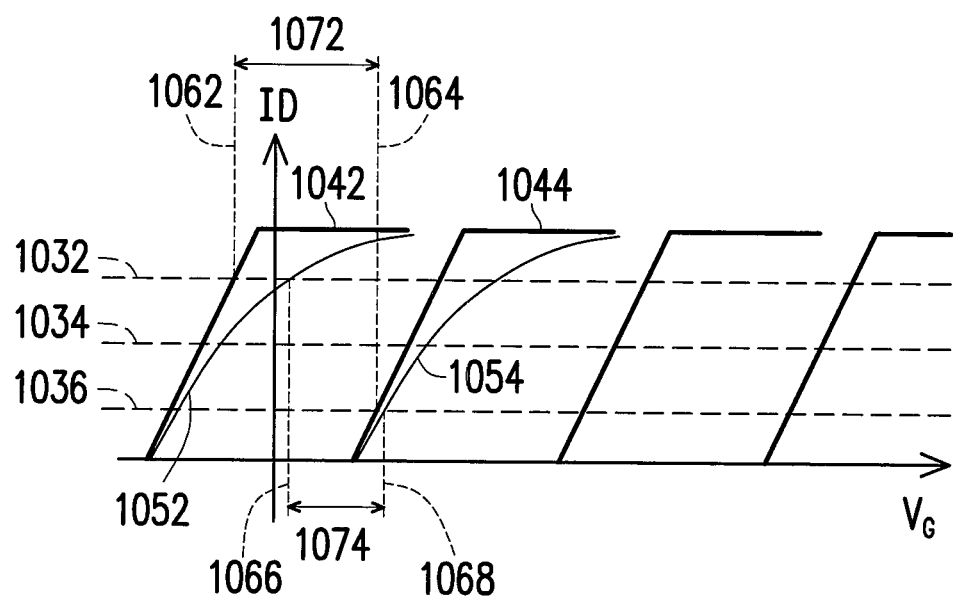
FIG. 10C is a schematic diagram of increasing the controllability according to the second exemplary embodiment.

FIG. 10C is a schematic diagram of increasing the controllability according to the second exemplary embodiment.

Referring to FIG. 10A, FIG. 10B, and FIG. 10C, curves 1042 and 1044 as illustrated in FIG. 10A represent a voltage-current curve when a negative voltage is applied to the conductor layer 630. On the other hand, curves 1052 and 1054 represent voltage-current curves when no negative voltage is applied to the conductor layer 630. First, the curves 1042 and 1044 are taken as an example. When a transistor is programmed to be corresponding to the distribution 1010a, the current amount 1032 corresponds to a voltage level 1062. When the transistor is programmed to be corresponding to the distribution 1010b, the current amount 1036 corresponds to the voltage level 1064. That is, the distribution corresponding to the transistor may not be falsely determined within an interval 1072. The curves 1052 and 1054 are taken as another example. The current amount 1032 corresponds to a voltage level 1066, and the current amount 1036 corresponds to a voltage level 1068. The distribution corresponding to the transistor may not be falsely determined within an interval 1074. It is noted that, from FIG. 10C, the width of the interval 1072 is greater than that of the interval 1074. That is, after a negative voltage is applied to the conductor layer 630, it is easier to determine the distribution corresponding to the transistor, and the controllability of the gate layer 130a is increased.

Figure 11:
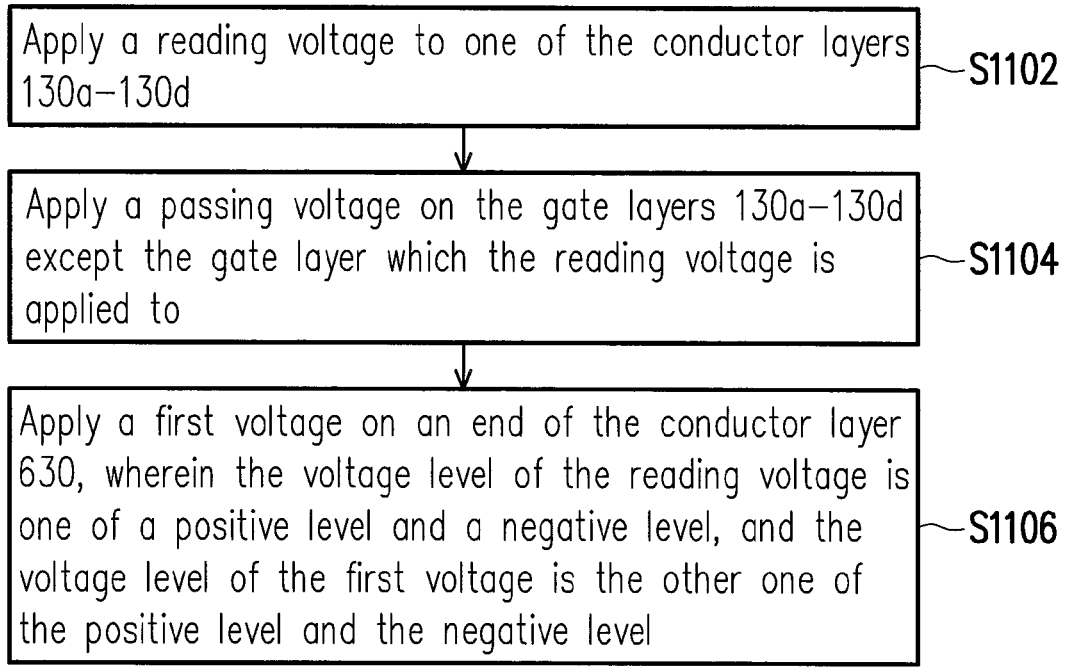
FIG. 11 illustrates a flowchart of a reading method according to the second exemplary embodiment.

FIG. 11 illustrates a flowchart of a reading method according to the second exemplary embodiment.

Referring to FIG. 11, each step in FIG. 11 is used for the NAND flash memory unit in FIG. 6A and FIG. 6B. A reading voltage is applied to one of the gate layers 130a-130d in Step S1102. A passing voltage is applied to the gate voltages 103a-130d except the one which the reading voltage is applied to in Step S1104. A first voltage is applied to an end of the conductor layer 630 in Step S1106. The voltage level of the reading voltage is one of a positive level and a negative level, and the voltage level of the first level is the other of the positive level and the negative level. That is, if the voltage level of the reading voltage is the positive level, the voltage level of the first level is the negative level (less than the voltage level at the ground end). If the voltage level of the reading voltage is the negative level, the voltage level of the first level is the positive level (greater than the voltage level at the ground end).

Each of the steps in FIG. 11 may be implemented by a plurality of programming codes, and such programming codes may be executed by a processor. Alternatively, each of the steps in FIG. 11 may be implemented as one or a plurality of circuits. The present invention is not limited herein.

On the other hand, an operating method is provided in an exemplary embodiment of the present invention, and such operating method is adapted to the first exemplary embodiment or the second exemplary embodiment. In such operating method, an electric potential difference is applied between a first end and a second end of a conductive structure for generating a current in the conductive structure and heating up a charge trapping layer. The operating method is described in detail hereinbefore and will not be repeated herein.

To sum up, an erasing operating is speeded up or a charge trapping layer is repaired by heating up the charge trapping layer in the operating method, the reading method, and the NAND flash memory unit proposed in the exemplary embodiments of the present invention. Moreover, in an exemplary embodiment, since a voltage applied to a conductor layer is opposite to a reading voltage, the controllability of gate layers is increased accordingly.

The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A NAND flash memory unit comprising:
a plurality of gate layers, wherein a first dielectric layer is comprised between two adjacent gate layers among the gate layers;
a tunnel layer, penetrating the gate layers;
a charge trapping layer, penetrating the gate layers and disposed between the tunnel layer and the gate layers;
a conductor layer, penetrating the gate layers; and
a second dielectric layer, penetrating the gate layers, wherein the second dielectric layer is disposed between the conductor layer and the tunnel layer.

2. The NAND flash memory unit according to claim 1, wherein the charge trapping layer comprises a silicon oxide-silicon nitride-silicon oxide composite layer.

3. The NAND flash memory unit according to claim 1, wherein a material of the conductor layer comprises a metal.

4. The NAND flash memory unit according to claim 1, wherein a material of the conductor layer comprises doped poly-silicon.

5. The NAND flash memory unit according to claim 1 further comprising:
   a first select gate layer, disposed on a side of the gate layers; and
   a second select gate layer, disposed on another side of the gate layers, wherein the tunnel layer, the charge trapping layer, the conductor layer, and the second dielectric layer penetrate the first select gate layer and the second select gate layer.

6. The NAND flash memory unit according to claim 1, wherein a material of the tunnel layer comprises amorphous silicon, poly-silicon, microcrystalline silicon, monocrystalline silicon, nanocrystalline silicon, an oxide semiconductor material, an organic semiconductor material, or a combination thereof.

7. A reading method for the NAND flash memory unit according to claim 1 comprising:
   applying a reading voltage to one of the gate layers;
   applying a passing voltage to another one of the gate layers;
   applying a first voltage to a side of the conductor layer, wherein a voltage level of the reading voltage is one of a positive level and a negative level, and a voltage level of the first voltage is other one of the positive level and the negative level.

8. The reading method according to claim 7, wherein the NAND flash memory unit further comprises:
   a first select gate layer, disposed on a side of the gate layers; and
   a second select gate layer, disposed on another side of the gate layers, wherein the tunnel layer, the charge trapping layer, the conductor layer, and the second dielectric layer penetrate the first select gate layer and the second select gate layer,
   wherein the reading method further comprises:
   applying a second voltage to the first select gate layer and the second select gate layer, wherein a voltage level of the second voltage is an addition of a system voltage level and a threshold voltage level.

9. The reading method according to claim 8 further comprising:
   pre-charging a first end of the tunnel layer to the system voltage level; and
   determining if a transistor corresponding to the gate layer applied by the reading voltage is turned on based on whether a voltage level at the first end of the tunnel layer is decreased.

* * * * *